US005198677A

United States Patent [19]

Leung et al.

[11] Patent Number: 5,198,677

[45] Date of Patent: Mar. 30, 1993

[54] PRODUCTION OF N+ IONS FROM A MULTICUSP ION BEAM APPARATUS

[75] Inventors: Ka-Ngo Leung, Hercules; Wulf B. Kunkel, Berkeley, both of Calif.; Steven R. Walther, Salem, Mass.

[73] Assignee: The United States of America as represented by the United States Department of Energy, Washington, D.C.

[21] Appl. No.: 774,912

[22] Filed: Oct. 11, 1991

[51] Int. Cl.[5] .............. H01J 37/08

[52] U.S. Cl. .............. 250/424; 250/423 R; 313/360.1

[58] Field of Search .............. 250/423 R, 427, 424; 313/360.1

[56] References Cited

U.S. PATENT DOCUMENTS

| | | | |
|---|---|---|---|
| 4,233,537 | 11/1980 | Limpaecher | 313/231.3 |
| 4,447,732 | 5/1984 | Leung et al. | 250/427 |
| 4,486,665 | 12/1984 | Leung et al. | 250/423 R |
| 4,529,571 | 7/1985 | Bacon et al. | 376/144 |
| 4,661,710 | 4/1987 | Verney et al. | 250/423 |
| 4,739,169 | 4/1988 | Kurosawa et al. | 250/423 |
| 4,793,961 | 12/1988 | Ehlers | 376/127 |
| 4,847,476 | 7/1989 | Sato et al. | 250/427 |

OTHER PUBLICATIONS

S. R. Walther et al., "Production of Atomic and Molecular Nitrogen Ion Beams Using a Multicusp and Microwave Ion Source", J. Appl. Phys., 63(12), 15 Jun. 1988, pp. 5678–5682.

K. N. Leung et al., "Small Multicusp H-Source", Rev. Sci. Instrum. 59 (3), Mar. 1988, pp. 453–456.

K. N. Leung et al., "Optimatization of H Production from a Multicusp Ion Source", Rev. Sci. Instrum. 60(4), Apr. 1989, pp. 531–538.

*Primary Examiner*—Bruce C. Anderson
*Attorney, Agent, or Firm*—Miguel A. Valdes; Roger S. Gaither; William R. Moser

[57] ABSTRACT

A method of generating a high purity (at least 98%) $N^+$ ion beam using a multicusp ion source (10) having a chamber (11) formed by a cylindrical chamber wall (12) surrounded by a plurality of magnets (13), a filament (57) centrally disposed in said chamber, a plasma electrode (36) having an extraction orifice (41) at one end of the chamber, a magnetic filter having two parallel magnets (21, 22) spaced from said plasma electrode (36) and dividing the chamber (11) into arc discharge and extraction regions. The method includes ionizing nitrogen gas in the arc discharge region of the chamber (11), maintaining the chamber wall (12) at a positive voltage relative to the filament (57) and at a magnitude for an optimum percentage of $N^+$ ions in the extracted ion beams, disposing a hot liner (45) within the chamber and near the chamber wall (12) to limit recombination of $N^+$ ions into the $N_2^+$ ions, spacing the magnets (21, 22) of the magnetic filter from each other for optimum percentage of $N^3$ ions in the extracted ion beams, and maintaining a relatively low pressure downstream of the extraction orifice and of a magnitude (preferably within the range of $3\text{-}8 \times 10^{-4}$ torr) for an optimum percentage of $N^+$ ions in the extracted ion beam.

6 Claims, 3 Drawing Sheets

PRODUCTION OF $N^+$ IONS FROM A MULTICUSP ION BEAM APPARATUS

The Government has rights in this invention pursuant to Contract No. DE-AC03-76SF000098 awarded by the United States Department of Energy.

The invention relates to multicusp ion sources and particularly those used to generate beams of nitrogen ions.

BACKGROUND OF THE INVENTION

Nitrogen ion implantation is used industrially to increase the surface hardness and wear resistance of metals, which can result in a tremendous increase in the lifetime of tools. This process does not require the elevated temperatures used for thermal diffusion of nitrogen into metals. In addition, it is not a coating, so it has no adhesion problems. The implantation process also has the effect of producing much smoother surfaces than for untreated material, resulting in less friction for contacting surfaces such as ball bearings. Deep implants are preferred, which makes the implantation of atomic nitrogen ions ($N^+$) rather than molecular nitrogen ions ($N_2^+$) necessary, since for a given acceleration energy $N^+$ ions are implanted deeper.

The best wear and corrosion resistance is achieved when implantation is done with only $N^+$ ions, rather than with a beam having both $N^+$ and $N_2^+$ ions, because the $N_2^+$ ions will have half the desired energy and will be shallowly implanted, resulting in a poor control over the implanted depth.

Ion sources providing a high current density are highly desirable since less time will be spent per part treated for the same ion dose. Nitrogen ion implantation is usually carried out at energies of 10–400 keV and dose levels of $10^{16}$–$10^{18}$ ions/cm$^2$.

Prior to the present invention, the ion sources available for ion implantation of materials had ion beams with too great a percentage of $N_2^+$ ions as to enable the ion beams to be used directly. In order to remove the undesired $N_2^+$ ions and produce a $N^+$ beam of sufficient purity for industrial application, mass separation procedures are used. These processes use a large magnet near the extracted beam to bend the paths of the ions in the beam. The paths of the $N^+$ ions will be bent more than the paths of the $N_2^+$ ions, thus enabling a beam to be produced having only $N^+$ ions.

A mass separation process imposes significant limits on implanter design by requiring relatively low energy in extraction so that a magnetic field of reasonable strength can provide sufficient bending for separation. Further, the need for the magnets downstream of the ion source will increase the length of the beam path to the material to be treated with consequent losses in energy. Further, since the beam has an appreciable cross-sectional area as it passes the magnet, the paths of the $N^+$ ions closes magnet will be bent to a greater extent than the paths of the $N^+$ ions further from the magnet such that there is an undesirable diffusion of the resulting $N^+$ ion beam. Elimination of the mass separation step would allow a simpler, more efficient, more compact implanter, with greater throughput of implanted parts.

A multicusp ion source capable of producing beams with greater than 90% $N^+$ ions has been described in S. A. Walther, K. N. Leung, and W. B. Kunkel "Production of atomic or molecular nitrogen ion beams using a multicusp and a microwave ion source," *J. Appl. Phys.*, 63(12), pp. 5678–5682, Jun. 15, 1988. Even though the percentage of atomic $N^+$ ions in the extracted beam is relatively high, the purity is still not sufficiently high as to enable ion implantation processes to be carried out without a mass separation process to remove the molecular $N_2^+$ ions from the beam. Further, the ion beam current density available from the described device is too low and the operating pressure is too high for practicable commercial operations.

SUMMARY OF THE INVENTION

It is the primary object of the present invention to provide an ion source, which will generate an $N^+$ ion beam having a high current density and substantially improved purity (at least 98% $N^+$ ions) so as to eliminate magnetic separation apparatus presently required and enable direct beam use in implantation applications.

Additional objects, advantageous and novel features will be set forth in the description which follows, and in part will become apparent to those skilled in the art upon examination of the following, or may be learned by practice of the invention. The objects and advantages of the invention may be realized and attained by means of instrumentalities and combinations pointed out in the appended claims.

To achieve the foregoing and other objects, and in accordance with the present invention as described and broadly claimed herein, an improved method of generating a high current density and high purity $N^+$ ion beam using a multicusp ion source having a chamber formed by a cylindrical chamber wall surrounded by a plurality of magnets, a filament centrally disposed in said chamber, a plasma electrode having an extraction orifice at one end of the chamber at a relatively low pressure, a magnetic filter having two parallel magnets spaced from said plasma electrode and dividing the chamber into arc discharge and extraction regions, the method including causing an electron flow to take place in said arc discharge region from said filament to said chamber wall, introducing nitrogen gas into said chamber, maintaining the chamber wall at a positive voltage relative to said filament and at a magnitude for an optimum percentage of $N^+$ ions in the extracted ion beam, disposing a hot liner within said chamber and near said chamber wall to limit recombination of $N^+$ ions into the $N_2^+$ ions, and spacing said magnets of said magnetic filter from each other for optimum percentage of $N^+$ ions in the extracted ion beams.

BRIEF DESCRIPTION OF THE DRAWINGS

The accompanying drawings, which are incorporated in and form part of the application, together with the description serve to explain the principles of the invention.

DESCRIPTION OF THE PREFERRED EMBODIMENTS

Figure 1:
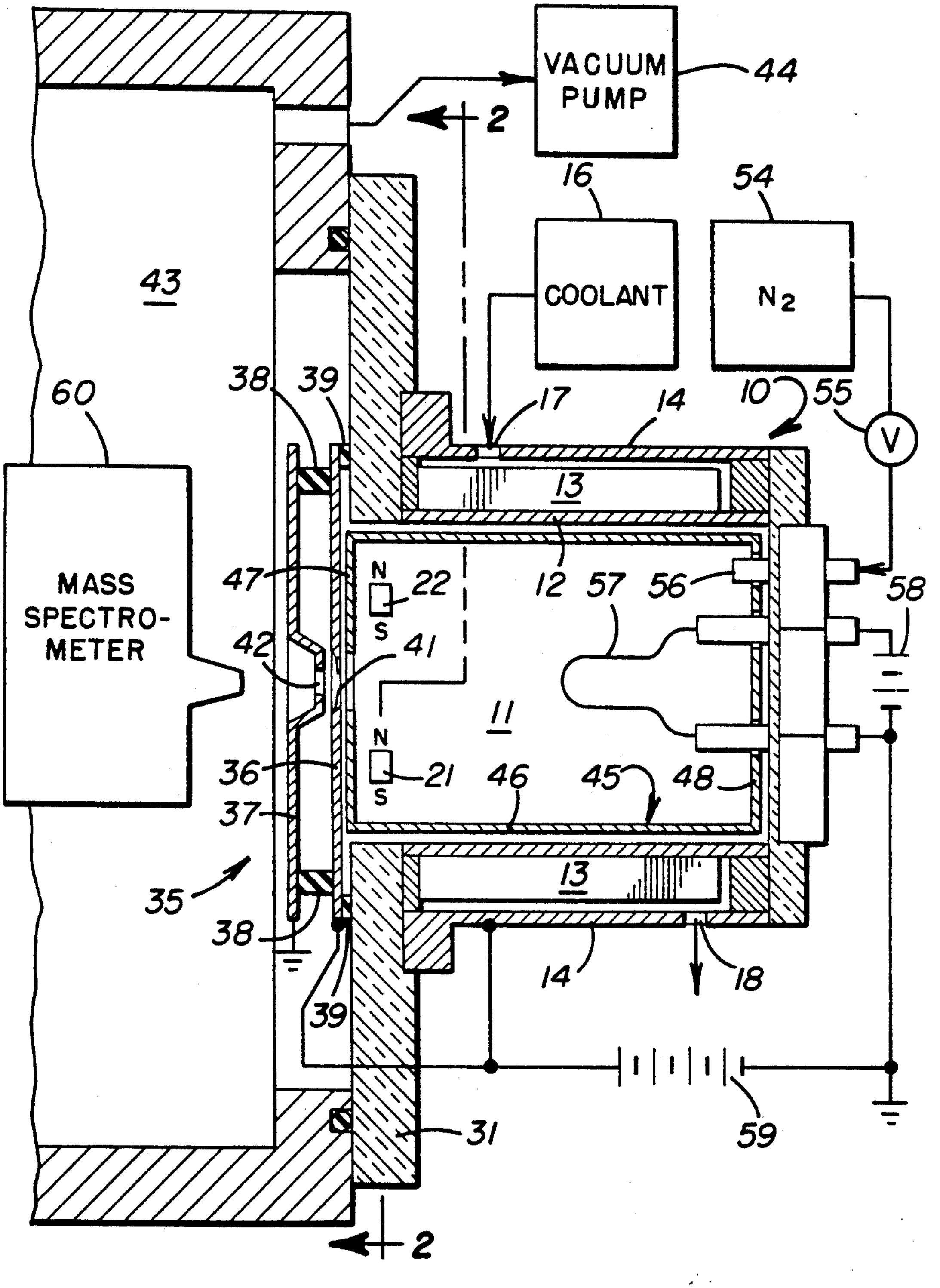
FIG. 1 is a sectional and partly schematic view of a multicusp ion source constructed in accordance with the invention.
Figure 2:
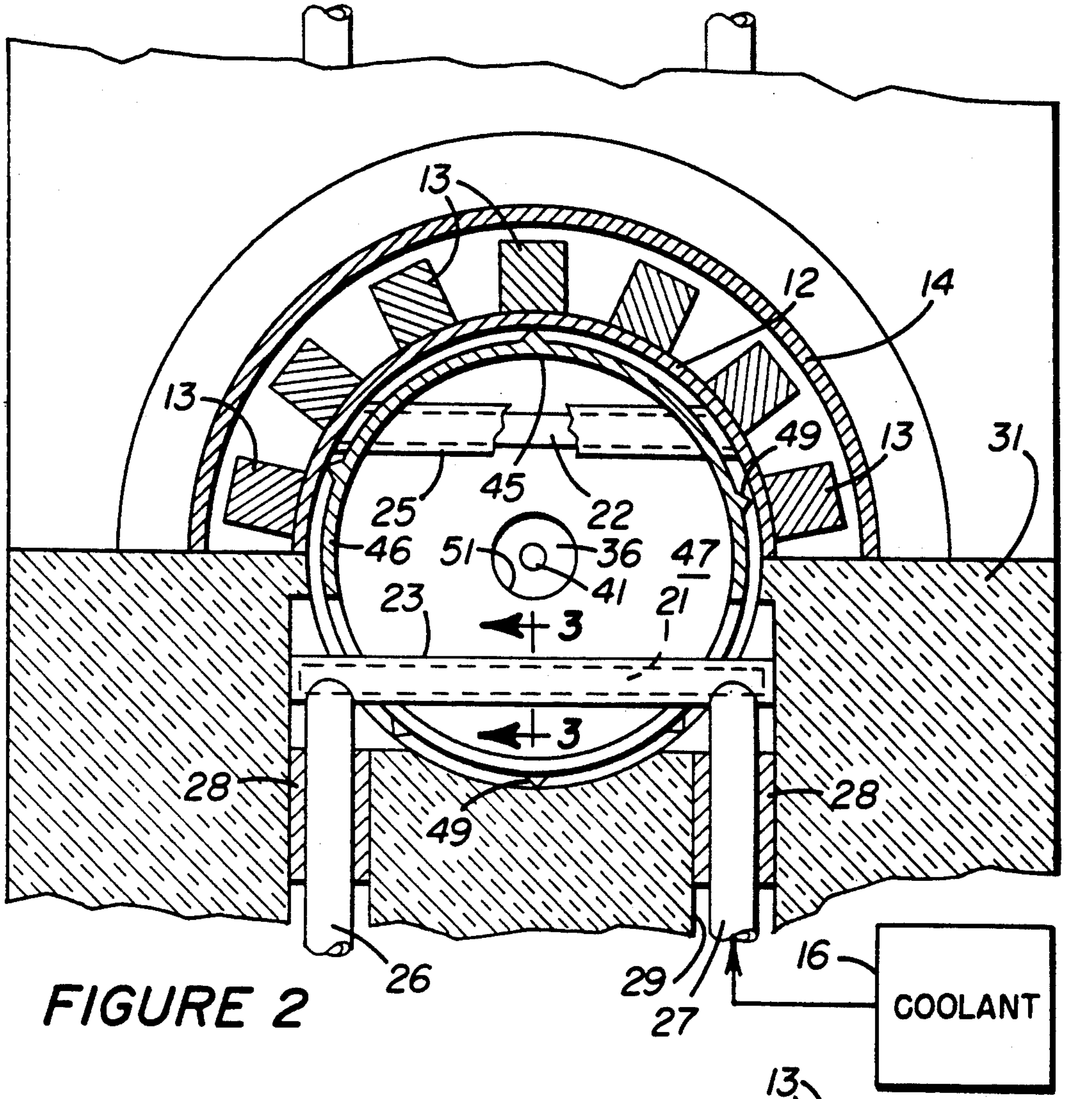
FIG. 2 is a sectional view of the ion source of FIG. 1, taken on line 2—2 thereof.
Figure 3:
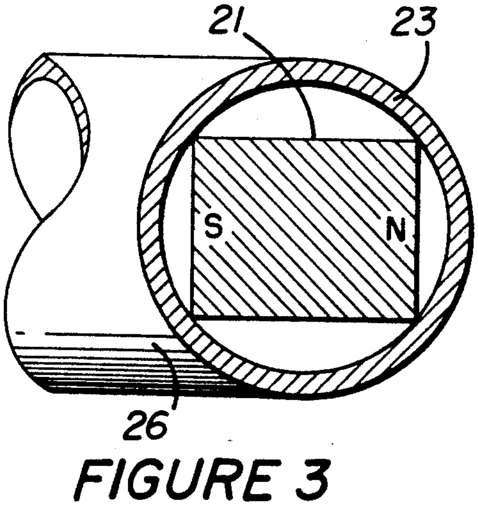
FIG. 3 is a sectional view of one of the magnetic filters of FIG. 2, taken on line 3—3 thereof.
Figure 4:
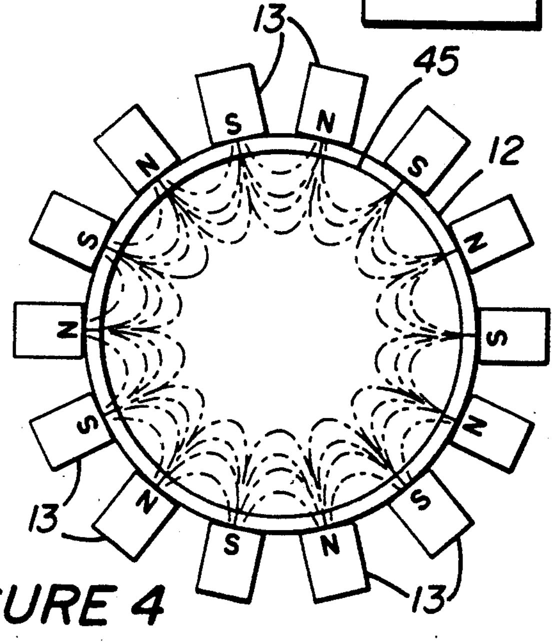
FIG. 4 is a diagrammatic representation of the multicusp magnetic field within the chamber of the ion source of FIGS. 1 and 2, with the magnetic field lines being shown in dotted lines.

Referring now to the drawings, and particularly to FIGS. 1-4, wherein a preferred embodiment of the invention is illustrated, the multicusp ion source 10 has a source chamber 11 formed by and within a thin-walled copper cylinder 12. Merely by way of example, in a working model of the invention cylinder 12 is 7.5 cm in internal diameter by 8 cm in length, with a wall thickness of 2 mm. The cylinder 12 is surrounded by fourteen columns of samarium-cobalt permanent magnets 13 to form a longitudinal line-cusp magnetic field configuration for primary electron and plasma confinement (FIG. 4). The permanent magnets 13 are in turn enclosed by an outer anodized aluminum cylinder 14. During high power discharge operation, adequate cooling of the magnets is provided by the circulation of a suitable coolant, such as water, between the two cylinders 12 and 14, the coolant coming from a suitable source 16, entering through inlet 17 and leaving through outlet 18.

A magnetic filter near the plane of extraction divides the chamber into arc discharge and extraction regions. As best seen in FIGS. 2 and 3, the filter comprises two samarium-cobalt magnets 21 and 22 parallel to each other, and encased in tubes 23. The tubes 23 each have legs 26 and 27 in mounting plates 31, the legs 26 and 27 being slidable in slide seals 28 to enable the magnets 21 and 22 to be adjustably moved towards or away from the longitudinal centerline of chamber 11. Coolant from source 16 will flow through tubes 23 during operation to cool magnets 21 and 22. The filter magnets 21 and 22 provide a transverse magnetic field which serves to prevent energetic primary electrons from reaching the extraction region, i.e. to the left of the magnets as viewed in FIG. 1. However, positive ions and low-energy electrons can diffuse across the filter into the extraction region to form a plasma.

The open end of the source chamber 11 is enclosed by a two electrode system 35 having two parallel plates 36 and 37 spaced apart from each other by insulators 38 and spaced from the non-conductive mounting plate 31 by insulators 39. Plates 36 and 37 each have a central orifice 41 and 42, respectively. In the above-mentioned working model, the orifice 41 through plate 36 is one millimeter in diameter. The orifices 41 and 42 of ion source 10 open into vacuum chamber 43 which is maintained at a low pressure by vacuum pump 44.

A sheet metal liner 45 of a high-temperature resistant material, such as molybdenum or tungsten, is provided within chamber 11, the liner 45 having a cylindrical portion 46, and end walls 47 and 48. Protuberances 49 project outwardly from the cylindrical portion 46 to serve two functions. First of all, they space the liner 45 from the copper cylinder 12 so that the liner is in poor thermal contact with cylinder 12 and will not be cooled by the coolant circulating between cylinders 12 and 14. Secondly, they provide a good electrical contact between the liner 45 and the cylinder 12. End wall 47 of the liner has a central opening 51.

Nitrogen gas, from source 54 passes through a pressure-reduction valve 55 and enters source chamber 11 at a low pressure through inlet tube 56. A nitrogen plasma is generated by the ionizing effect of primary electrons emitted from a hairpin tungsten filament 57 located at the center of the source chamber 11. DC source 58 heats the filament 57, and DC source 59 maintains the chamber wall 12, liner 45, tubes 23 containing filter magnets 21 and 22, and the plasma electrode 36 as the anode for the electron discharge from the filament 57.

During operation, electrons emitted from the filament 57 will ionize the nitrogen gas from source 52. Typically, about 3% of the nitrogen gas will be ionized. The filter magnets 21 and 22 are adjusted relative to the longitudinal centerline of the chamber for an optimum percentage of atomic $N^+$ ions and a high ion density in the beam extracted from orifice 41 in the plasma electrode 36. Two reasons may contribute to the large increase in $N^+$ ions when the filter is used. First, the filter essentially turns back energetic electrons and essentially eliminates primary electrons (and therefore direct ionization of $N^+$) from the extraction region. This leaves a smaller source volume in which the primary electrons deposit their energy, creating a more intense discharge in this region, which enhances two-step production of $N^+$. The second reason for extracting more $N^+$ is that the transport of the $N^+$ ion species across the magnetic field liner of the filter is much greater than that of the $N_2^+$ ions. $N^+$ ions created by disassociative ionization typically have energies of 0.25 eV to several eV, while $N_2^+$ is created cold. Thus, an $N^+$ ion has a larger gyroradius and passes through the filter field more easily than a $N_2^+$ ion. Hence, the reduction of $N_2^+$ production in the extraction region, combined with greater $N^+$ production and transport to the extraction gives the filter discharge a much higher percentage of $N_2^+$ ions for given operating parameters.

The plasma electrode 36 is electrically connected, and at the same potential as the walls of the source chamber, to reduce the energy of any secondary emission electrons from the plasma electrode to about 4 eV. This energy is insufficient to ionize $N_2^+$ ions from the ambient nitrogen gas and thus the purity of the emitted beam will not be degraded by secondary emission.

During high power discharge operations the liner 45 is heated by the discharge and provides a hot surface which functions to limit recombination of $N^+$ ions into $N_2^+$ ions.

It is desirable that the ion source 10 be operated at low pressure for several reasons. First, operation at a low pressure will increase the total ion output ($N^+ + N^+{}_2$) from the extraction orifice 41. If the pressure in the source chamber (produced by the continual inflow of nitrogen gas) is relatively high, the plasma is collisional, with a steep plasma density gradient—high near the electrode 57 and low at the extraction orifice 41—resulting in a low total ion flow from the extraction orifice. At a relatively low pressure in the source chamber there are fewer collisions and the plasma density distribution gradient is more uniform from the electrode to the extraction orifice. This results in a more efficient operation with a higher total ion current output.

Secondly, the lower the pressure of operation for desired results, the less the pumping capacity need be to maintain the vacuum chamber 43 at the desired low pressure level. For example, in the ion source disclosed in the previously mentioned article in *J. Appl. Phys.* 63 (12), the nitrogen gas flow rate of 4 to 9 standard cubic centimeters (SCCM) was required to provide for 90+% $N^+$ ions in the extracted beam. Since only about 3% of the gas ionizes, the remaining 97% of the gas will flow through the extraction orifice into the lower pressure vacuum chamber. The vacuum pump must continuously remove this gas in order to keep the vacuum chamber at the proper low pressure.

In the present invention, operation is carried on at a low rate of from 1 to 2 SCCM of nitrogen gas into the source chamber 11, which produces a much lower pressure therein, and in the order of from 3 to $9\times10^{-2}$ torr. With an extraction orifice 41 having a one millimeter diameter, the pressure in the vacuum chamber 43 will be in the order of from 3 to $9\times10^{-4}$ torr. Since the flow rate of gas into source chamber 11 is considerably reduced, as compared to prior operation, the flow rate of gas into the vacuum chamber 43 will likewise be greatly reduced. Vacuum pumps are very expensive and thus a decrease in the amount of pumping capacity necessary to maintain desired pressure level will greatly reduce the cost of the system.

In order to test the operation of the model ion source 10, as described below, a magnetic deflection spectrometer 60 was located in vacuum chamber 43 downstream of the orifices 41 and 42 for measurement of the ion species in the extracted beam.

EXPERIMENTAL RESULTS

The dependence of the percentage of extracted $N^+$ ion species on various operating parameters has been explored, by use of the above mentioned working model, to determine the optimal conditions for generating a high percentage of $N^+$ ions.

Figure 5:
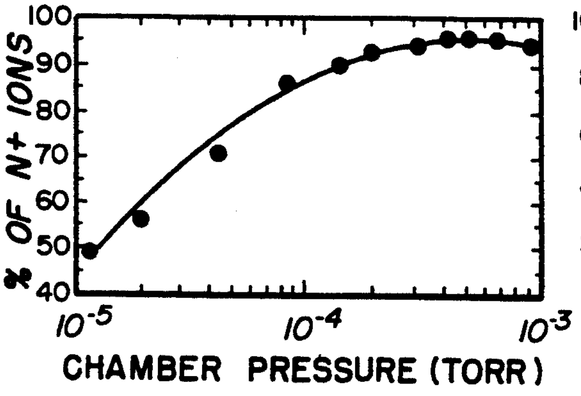
FIGS. 5 and 6 are plots of the percentage of $N^+$ ions as a function of the operating pressure in the vacuum chamber, with the filter magnets in place (FIG. 5) and removed (FIG. 6).

FIG. 5 is a plot of the percentage of $N^+$ ions in the extracted beam as a function of the operating pressure in the vacuum chamber 43 (downstream from extraction orifice 41), with the filter magnets 21 and 22 is place, with a discharge voltage of 80 volts and with a discharge current from the filament 57 of 10 amperes. The plot shows that at operating pressures within the range or $3\text{-}8\times10^{-4}$ torr the $N^+$ percentage exceeds 95%. The reason for this pressure dependence is not presently known, but may be due to charge exchange of the $N_2^+$ ions with the background $N^+$ gas.

Figure 6:
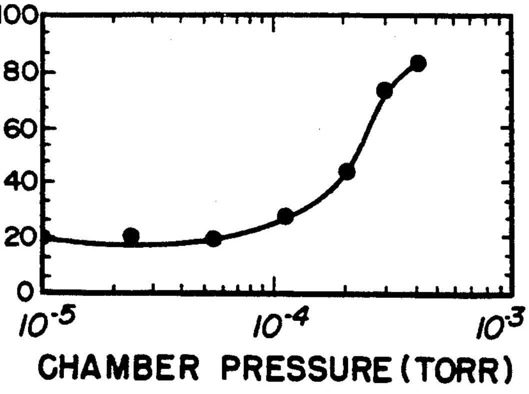

A similar test was performed, but with the filter magnets 21 and 22 removed. The results are shown in FIG. 6. In this test the discharge parameters were a discharge voltage of 100 volts and a discharge current of 6 amperes. Again, a strong pressure dependence is shown, but the $N^+$ percentage was much poorer than for the filtered discharge under similar conditions. The reason for the improved $N^+$ percentage in a filtered discharge is attributed to the absence of $N_2^+$ ion production in the extraction region. The filter magnets prevent energetic electrons from reaching the extraction area where they can ionize the background $N^+$ gas, creating $N_2^+$ ions.

The following tests were conducted with the filter magnets 21 and 22 in place.

Figure 7:
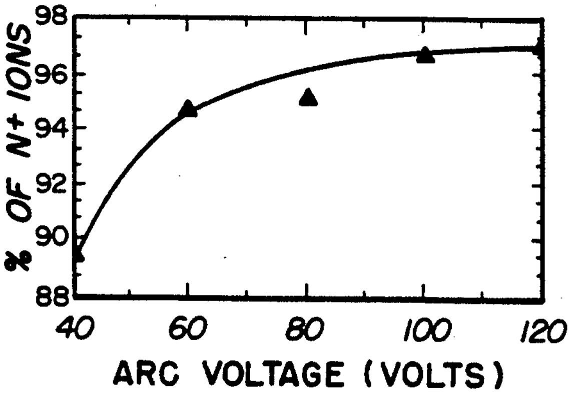
FIGS. 7 and 8 are plots of the percentage of $N^+$ ions as a function of arc voltage (FIG. 7) and arc current (FIG. 8).

The dependent of $N^+$ output on the discharge voltage was investigated for a constant discharge current of 10 amperes and a vacuum chamber pressure of $3.7\times10^{-4}$ torr. The results are plotted in FIG. 7 and show increased $N^+$ ion production for higher discharge voltages. This dependence is expected since it is known that the cross section for dissociative ionization of $N^+$ (via $e+N_2\rightarrow N+N^++2e$ or $e+N_2\rightarrow 2N^++3e$) increases faster with electron energy than simple ionization of $N_2$ ($e+N_2\rightarrow N_2^++2e$), in the energy range of 40–120 eV electron energy.

Figure 8:
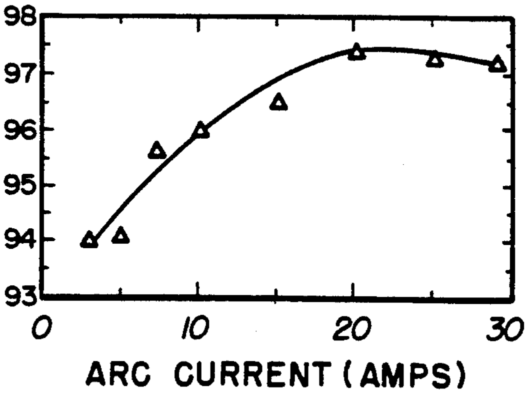

The species dependence on discharge current is plotted in FIG. 8 for a discharge voltage of 80 volts and a vacuum chamber pressure of $3.7\times10^{-4}$ torr. The $N^+$ fraction increases slowly with discharge current and exceeds 97% for a discharge current of 20 amperes. This result is likely to be due to the increase in $N^+$ production by two-step processes such as dissociation of $N_2^+$ ions or ionizations of N atoms.

Figure 9:
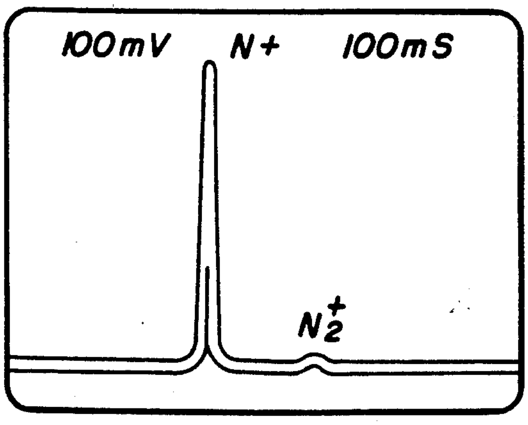
FIG. 9 shows a mass spectrometer signal detailing the ion species in the extracted beam.

To optimize the $N^+$ fraction in the extracted ion beam, the ion source 10 was operated with the magnetic filter magnets 21 and 22 adjusted for maximum $N^+$ production with a relatively low gas pressure ($6.8\times10^{-4}$ torr in the vacuum chamber 43), a discharge voltage of 95 volts and a discharge current of 20 amperes. FIG. 9 shows a mass spectrometer signal detailing the ion species in the extracted beam. For these operating conditions, 98.6% of the beam current is atomic $N^+$ ions. A beam with this high percentage of $N^+$ ions is sufficiently pure that practicable ion implantation processes can be carried out without the heretofore required mass separation step. Further, the ion beam current is approximately 100 mA/cm$^2$, as compared to the current density of about 8 mA/cm$^2$ for the high $N^+$ ion beam obtained by the multicusp ion source in the previously mentioned article in *J. Appl. Phys.* 63(12).

The present invention differs from the multicusp ion source disclosed in *J. Appl. Phys.* 63(12) in a number of ways which will enable practicable ion implantation processes to be carried out without mass separation of the ion beam and with a high ion beam current density.

(1) The adjustable filter field achieves a high (99%) percent of $N^+$ ions passing through the field and a high ion beam density;

(2) The hot liner 45 significantly reduces the recombination of the $N^+$ ions;

(3) The operation of the plasma electrode 36 at the same anode potential as the chamber wall 12 and liner 45 reduces the secondary emission electron energy so that there is no $N_2^+$ ionization of the background gas in the extraction region;

(4) The physical size of the chamber 11 is greater, providing a larger field-free space to put the filament for quiescent discharge, and enabling the ion beam to be larger for more efficient nitrogen implantation of materials, and (5) The gas flow rate and operating pressure are considerably reduced, so that less expensive vacuum pumps can be used.

The foregoing description of the preferred embodiments has been presented for purposes of illustration and description. It is not intended to be exhaustive or to limit the invention to the precise forms described, and obviously many other modifications are possible in light of the above teaching. The embodiments were chosen in order to explain most clearly the principles of the invention and its practical applications thereby to enable others in the art to utilize most effectively the invention in various other embodiments and with various other modifications as may be suited to the particular use contemplated. It is intended that the scope of the invention be defined by the claims appended thereto.

I claim:

1. The method of generating a high purity atomic $N^+$ ion beam using a multicusp ion source having a chamber formed by a cylindrical chamber wall surrounded by a plurality of magnets, a filament centrally disposed in said chamber, a plasma electrode having an extraction orifice at one end of the chamber, a magnetic filter having two parallel magnets spaced from said plasma electrode and dividing the chamber into arc discharge and extraction regions, the method comprising:

(a) causing an electron flow to take place in said arc discharge region from said filament to said chamber wall, (b) introducing nitrogen gas into said chamber, (c) maintaining the chamber wall at a positive voltage relative to said filament and at a magnitude for an optimum percentage of $N^+$ ions in the extracted ion beam, (d) disposing a hot liner within said chamber and near said chamber wall to limit recombination of atomic $N^+$ ions into molecular $N_2^+$ ions, (e) spacing said magnets of said magnetic filter from each other for optimum percentage of $N^+$ ions in the extracted ion beams, and (f) maintaining a relatively low operating pressure downstream of said extraction orifice and of a magnitude for an optimum percentage of atomic $N^+$ ions in the extracted ion beam.

2. The method of generating high purity atomic $N^+$ ion beams as set forth in claim 1, and further including: maintaining said plasma electrode at the same voltage as that of said chamber wall to prevent secondary emission of electrons from said plasma electrode from having sufficient energy to ionize molecular $N_2^+$ ions.

3. The method of generating high purity $N^+$ ion beams as set forth in claim 1, and further including: maintaining said liner in good electrical contact with said chamber wall and in poor heat transfer relation to said chamber wall.

4. The method of generating high purity atomic $N^+$ ion beams as set forth in claim wherein the operating pressure downstream of said extraction orifice is maintained at the pressure within the range of $3\text{-}8\times10^{-4}$ torr.

5. The method of generating high purity atomic $N^+$ ion beams as set forth in claim 4, and further including: maintaining said plasma electrode at the same voltage as that of said chamber wall to prevent secondary emission of electrons from said plasma electrode from having sufficient energy to ionize molecular $N_2^+$ ions.

6. The method of generating high purity atomic $N^+$ ion beams as set forth in claim 5, and further including: maintaining said liner in good electrical contact with said chamber wall and in poor heat transfer relation to said chamber wall.

* * * * *